(12) United States Patent
Takeya et al.

(10) Patent No.: US 10,205,094 B2
(45) Date of Patent: Feb. 12, 2019

(54) ORGANIC SEMICONDUCTOR THIN FILM PRODUCTION METHOD

(71) Applicants: OSAKA UNIVERSITY, Suita-shi, Osaka (JP); PI-CRYSTAL INC., Osaka-shi, Osaka (JP)

(72) Inventors: Junichi Takeya, Kashiwa (JP); Junshi Soeda, Hino (JP)

(73) Assignee: PI-CRYSTAL INC., Chiba (JP)

( * ) Notice: Subject to any disclaimer, the term of this patent is extended or adjusted under 35 U.S.C. 154(b) by 0 days.

(21) Appl. No.: 14/786,835

(22) PCT Filed: Apr. 23, 2014

(86) PCT No.: PCT/JP2014/061472
§ 371 (c)(1),
(2) Date: Oct. 23, 2015

(87) PCT Pub. No.: WO2014/175351
PCT Pub. Date: Oct. 30, 2014

(65) Prior Publication Data
US 2016/0104842 A1    Apr. 14, 2016

(30) Foreign Application Priority Data

Apr. 25, 2013    (JP) ................................. 2013-092795

(51) Int. Cl.
*H01L 29/08*    (2006.01)
*H01L 51/00*    (2006.01)
(Continued)

(52) U.S. Cl.
CPC ............ *H01L 51/0003* (2013.01); *B05C 5/02* (2013.01); *B05C 5/0254* (2013.01);
(Continued)

(58) Field of Classification Search
CPC .................................................... H01L 51/0003
(Continued)

(56) References Cited

U.S. PATENT DOCUMENTS

2007/0243658 A1*  10/2007  Hirai .................. H01L 51/0004
                                                                          438/99
2008/0138927 A1    6/2008   Headrick
(Continued)

FOREIGN PATENT DOCUMENTS

JP          63-236566      10/1988
JP          9-092617       4/1997
(Continued)

OTHER PUBLICATIONS

Tracz, et al., "Uniaxial Alignment of the Columnar Super-Structure of a Hexa (Alkyl) Hexa-peri-hexabenzocoronene on Untreated Glass by Simple Solution Processing", Journal of the American Chemical Society, vol. 125, American Chemical Society, 2003, pp. 1682-1683.
(Continued)

*Primary Examiner* — Ajay K Arora
(74) *Attorney, Agent, or Firm* — Hamre, Schumann, Mueller & Larson, P.C.

(57) ABSTRACT

A raw material solution (6), in which an organic semiconductor material is dissolved in a solvent, is supplied to a substrate (1). The solvent is evaporated so that crystals of the organic semiconductor material are precipitated. Thus, an organic semiconductor thin film (7) is formed on the substrate (1). An edge forming member (2) having a contact face (2a) on one side is used and located opposite the substrate (1) so that the plane of the contact face (2a) intersects the surface of the substrate (1) at a predetermined angle. The raw material solution (6) is supplied to the substrate (1) and formed into a droplet (6a) that comes into
(Continued)

contact with the contact face (2a). The substrate (1) and the edge forming member (2) are moved relative to each other in a direction parallel to the surface of the substrate (1) so as to separate the edge forming member (2) from the droplet (6a), and while the raw material solution (6) is supplied so that a change in size of the droplet (6a) with the relative movement is maintained within a predetermined range, the solvent contained in the droplet (6a) is evaporated to form the organic semiconductor thin film (7) on the substrate (1) after the contact face (2a) has been moved. In this manner, a large-area organic semiconductor single crystal thin film having high charge mobility can be manufactured by a simple process using a solvent evaporation method based on droplet formation.

11 Claims, 11 Drawing Sheets

(51) Int. Cl.
    *B05C 5/02* (2006.01)
    *B05C 11/04* (2006.01)
    *B05C 11/02* (2006.01)
    *C30B 19/06* (2006.01)
    *C30B 29/58* (2006.01)
    *H01L 51/05* (2006.01)

(52) U.S. Cl.
    CPC ............ *B05C 11/028* (2013.01); *B05C 11/04* (2013.01); *C30B 19/063* (2013.01); *C30B 29/58* (2013.01); *H01L 51/0508* (2013.01); *H01L 51/0068* (2013.01); *H01L 51/0558* (2013.01)

(58) Field of Classification Search
    USPC .......................................................... 257/40
    See application file for complete search history.

(56) References Cited

U.S. PATENT DOCUMENTS

| | | | |
|---|---|---|---|
| 2012/0193618 A1* | 8/2012 | Takeya | H01L 51/0004 257/40 |
| 2013/0143357 A1 | 6/2013 | Goto et al. | |

FOREIGN PATENT DOCUMENTS

| | | |
|---|---|---|
| JP | 2007-294721 | 11/2007 |
| JP | 2009-140969 | 6/2009 |
| JP | 2009140969 A * | 6/2009 |
| JP | 2013-077799 | 4/2013 |
| WO | 2011/040155 | 4/2011 |
| WO | 2012/026333 | 3/2012 |

OTHER PUBLICATIONS

Pisula, et al., Uniaxial Alignment of Polycyclic Aromatic Hydrocarbons by Solution Processing, Chemistry of Materials, vol. 17, American Chemical Society, 2005, pp. 2641-2647.

Larsen-Olsen, et al., "Simultaneous multilayer formation of the polymer solar cell stack using roll-to-roll double slot-die coating from water", Solar Energy Materials & Solar Cells, vol. 97, Sep. 23, 2011, pp. 22-27.

* cited by examiner

ORGANIC SEMICONDUCTOR THIN FILM PRODUCTION METHOD

TECHNICAL FIELD

The present invention relates to a method for manufacturing an organic semiconductor thin film by a solvent evaporation method, and particularly to a method suitable for the manufacture of a large-area organic semiconductor single crystal thin film having high mobility. The present invention also relates to an organic semiconductor device including the organic semiconductor single crystal thin film.

BACKGROUND ART

In recent years, organic semiconductor materials have been found to be superior to inorganic semiconductor materials in electrical characteristics, and have been increasingly developed and applied to various fields of electronic devices. An organic semiconductor device such as an organic TFT (thin film transistor) includes an organic semiconductor thin film as a semiconductor channel. The organic semiconductor device can easily be processed compared to an inorganic semiconductor device, and therefore can be obtained by a simple low-cost manufacturing process. Moreover, since the organic semiconductor device can be manufactured at about room temperature, a semiconductor technology using a plastic substrate becomes available. Thus, the organic semiconductor device is expected as a post-silicon semiconductor.

Various methods have been studied to manufacture a crystalline organic semiconductor thin film used in the organic TFT in view of the material characteristics. Conventional methods include, e.g., a vapor deposition method, a molecular beam epitaxial method, a solvent evaporation method, a melt method, and a Langmuir-Blodgett method. Among these methods, the solvent evaporation method is simple and able to provide a high-performance organic semiconductor thin film. In particular, the process of the solvent evaporation method is based on an application method of a solution such as droplet formation, spin coating, or printing. Therefore, the solvent evaporation method shows great promise to manufacture an organic semiconductor thin film at about room temperature in a simple and inexpensive manner.

In the application method, a solution of an organic semiconductor material is applied or dropped to the surface of a substrate, and then a solvent contained in the solution is dried. As the solvent is evaporated, the solution becomes saturated and crystals are precipitated from the solution. Thus, an organic semiconductor thin film is formed. Known technologies such as droplet formation and spin coating can easily be applied to the manufacture of a large-area organic semiconductor thin film. The performance of the typical organic TFT formed by the application method is represented by a carrier mobility as high as about 0.1 $cm^2$/Vs. However, such a value for the conventional mobility is unsatisfactory. The mobility is insufficient because the presence of the grain boundary and the irregularity of the molecular orientation interfere with the charge transport.

In order to improve the regularity of the molecular arrangement, the growth of an organic semiconductor single crystal thin film has been studied. For example, Patent Document 1 discloses an improved method for manufacturing an organic semiconductor single crystal thin film having electrical characteristics, particularly high charge mobility, required for the organic TFT by using the solvent evaporation method based on droplet formation.

The manufacturing method of Patent Document 1 will be described with reference to FIGS. 12 to 15. FIG. 12 is a perspective view showing a basic process. FIG. 13 is a cross-sectional view of FIG. 12. The manufacturing method uses a substrate 20 and an edge contact member 21 made of a resin. A raw material solution containing an organic semiconductor material and a solvent is supplied to the substrate 20 and brought into contact with the edge contact member 21 to form a droplet 22, as shown in FIGS. 12 and 13. In this state, the droplet 22 is dried, and an organic semiconductor thin film 23 is formed on the substrate 20. The edge contact member 21 includes a planar contact face 21a as a part of the end faces that intersect the surface of the substrate 20. The droplet 22 is formed in contact with the contact face 21a.

In the manufacturing process, first, the edge contact member 21 is placed on the substrate 20 so that the contact face 21a is perpendicular to a predetermined direction A of the substrate 20. In this state, when the raw material solution is supplied, the droplet 22 of the raw material solution is held by the contact face 21a under the action of a constant force. The solvent contained in the droplet 22 is evaporated by a drying process while the droplet 22 is held by the contact face 21a. Then, as shown in FIG. 13, the saturation of the raw material solution and the precipitation of crystals of the organic semiconductor material occur successively in the far end portion of the droplet 22 relative to the contact face 21a in the direction A. In FIG. 13, alternate long and short dash lines e1, e2 indicate the movement of the far end of the droplet 22 due to the evaporation of the solvent. As the solvent is evaporated, the crystals grow along the direction A of the substrate 20 toward the contact face 21a, and thus the organic semiconductor thin film 23 is gradually formed.

In the drying process, the attachment of the droplet 22 of the raw material solution to the contact face 21a produces the effect of defining the direction of the crystal growth via the contact with the contact face 21a. This effect can control the crystallinity and improve the regularity of the molecular arrangement of the organic semiconductor material, thereby contributing to an increase in electron conductivity (mobility).

However, in the above basic process, the crystal growth ends with the evaporation of the solvent. Therefore, the size of the organic semiconductor thin film 23 is small, which is less than 1 mm at most. For this reason, to provide a practical organic TFT using the above method, an organic semiconductor thin film array is manufactured, as shown in FIGS. 14 and 15. In FIG. 14, this method uses a contact member 26 including an auxiliary substrate 24 and a plurality of contact protrusions 25 arranged on the auxiliary substrate 24. Each of the contact protrusions 25 has the same function as that of the edge contact member 21 shown in FIG. 12. Specifically, each of the contact protrusions 25 includes a contact face 25a as a part of the end faces that intersect the surface of the auxiliary substrate 24.

First, to create a state in which droplets are held, as shown in FIG. 14, the contact member 26 is located above the substrate 20 with the contact protrusions 25 facing the substrate 20, and the contact protrusions 25 are put on the substrate 20. In this state, a raw material solution is supplied and brought into contact with each of the contact faces 25a to form droplets 22. The droplets 22 of the raw material solution are held by the contact faces 25a, respectively. Then, a drying process is performed to evaporate the solvent contained in the droplets 22. Like the above manufacturing method, crystals of the organic semiconductor material grow as the solvent is evaporated in each of the droplets 22. Consequently, as shown in FIG. 15, organic semiconductor thin films 23a are formed in the positions of the substrate 20 that correspond to each of the contact faces 25a. Thus, an organic semiconductor thin film array can be manufactured.

PRIOR ART DOCUMENTS

Patent Documents

Patent Document 1; WO 2011/040155 A1

DISCLOSURE OF INVENTION

Problem to be Solved by the Invention

As described above, in the method of Patent Document 1, there is a limit to the size of the organic semiconductor single crystal thin film that can be formed. Moreover, even if the organic semiconductor thin film array is manufactured to provide a practical organic TFT, there is a limit to the functions and properties of the organic TFT as an electronic device and also to the ease of the manufacturing process.

Therefore, it is an object of the present invention to provide a method for manufacturing an organic semiconductor thin film that is performed by a simple process using a solvent evaporation method based on droplet formation, and that can provide a large-area organic semiconductor single crystal thin film having high charge mobility.

It is also an object of the present invention to provide an organic semiconductor device including the organic semiconductor single crystal thin film.

Means for Solving Problem

A method for manufacturing an organic semiconductor thin film of the present invention includes the following; supplying a raw material solution, in which an organic semiconductor material is dissolved in a solvent, to a substrate; evaporating the solvent so that crystals of the organic semiconductor material are precipitated; and forming an organic semiconductor thin film on the substrate.

To solve the above problem, the method of the present invention uses an edge forming member having a contact face on one side. The edge forming member is located opposite the substrate so that a plane of the contact face intersects a surface of the substrate at a predetermined angle. The raw material solution is supplied to the substrate and formed into a droplet that comes into contact with the contact face. The substrate and the edge forming member are moved relative to each other in a direction parallel to the surface of the substrate so as to separate the edge forming member from the droplet, and while the raw material solution is supplied so that a change in size of the droplet with the relative movement is maintained within a predetermined range, the solvent contained in the droplet is evaporated to form the organic semiconductor thin film on the substrate after the contact face has been moved.

An organic semiconductor device of the present invention includes a substrate and an organic semiconductor thin film formed on the substrate. The organic semiconductor thin film is a single crystal thin film having a rectangular planar shape that is 1 cm or more on a side and 100 nm or less thick.

Effects of the Invention

According to the method for manufacturing an organic semiconductor thin film having the above configuration, since the crystal growth will not end with the evaporation of the solvent from the raw material solution, the organic semiconductor thin film can be formed to have a desired large area in accordance with the movement distance of the edge forming member by the continuous process.

Moreover, the droplet of the raw material solution is controlled via the contact with the contact face. Therefore, the shape of the droplet is asymmetric in the direction perpendicular to the contact face, and the solvent is evaporated asymmetrically. This produces the effect of defining the direction of the crystal growth. When the direction of the crystal growth is defined, the regularity of the molecular arrangement of the organic semiconductor material can be improved, and a uniform single crystal thin film can be formed continuously.

The organic semiconductor device having the above configuration includes the organic semiconductor thin film that is a single crystal thin film with a thickness of 100 nm or less. Therefore, even if the organic semiconductor thin film has a rectangular planar shape of a large area that is 1 cm or more on a side, a variation in thickness can easily be controlled within ±20%. Thus, the organic semiconductor thin film can have uniform high mobility over the entire region, so that the organic semiconductor device can have excellent properties for practical use.

DESCRIPTION OF THE INVENTION

A method for manufacturing an organic semiconductor thin film of the present invention may have the following aspects based on the above configuration.

In an aspect, the droplet may be formed to have a shape whose thickness, measured from the surface of the substrate, gradually decreases with increasing distance from the contact face.

It is preferable that the surface of the substrate on which the droplet of the raw material solution is formed has a contact angle of 30° or less.

In an aspect, the edge forming member may be spaced from the substrate by a predetermined gap, and the raw material solution may be supplied through the gap from one or more raw material solution supply ports that are located adjacent to the gap on the opposite side of the edge forming member with respect to the contact face. In this case, a plurality of the raw material solution supply ports may be provided, and each of the raw material solution supply ports may supply different types of raw material solutions, so that different types of organic semiconductor thin films may be simultaneously formed on the same substrate.

Alternatively, in an aspect, the raw material solution may be supplied to the side of the edge forming member facing the contact face through one or more inner cavities provided inside of the edge forming member. In another aspect, the edge forming member may be spaced from the substrate by a predetermined gap, and the raw material solution is supplied to the surface of the substrate directly under the edge forming member through one or more inner cavities provided inside of the edge forming member. In both cases, the edge forming member may have a plurality of the inner cavities, and different types of raw material solutions may be supplied through each of the inner cavities, so that different types of organic semiconductor thin films may be simultaneously formed on the same substrate.

An organic semiconductor device of the present invention may have the following aspects based on the above configuration. It is preferable that a distribution of crystallographic axes of the single crystals of the organic semiconductor thin film is in a range of 8°. Moreover, it is preferable that the surface of the substrate on which the organic semiconductor thin film is formed has a contact angle of 30° or less.

Hereinafter, embodiments of the present invention will be described with reference to the drawings.

Embodiment

Figure 1A:
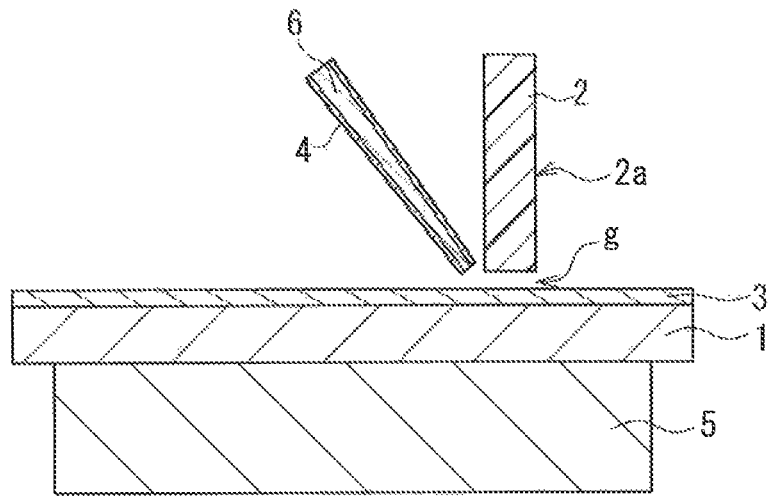
FIG. 1A is a cross-sectional view showing an apparatus used to perform a method for manufacturing an organic semiconductor thin film array of an embodiment of the present invention.
Figure 1B:
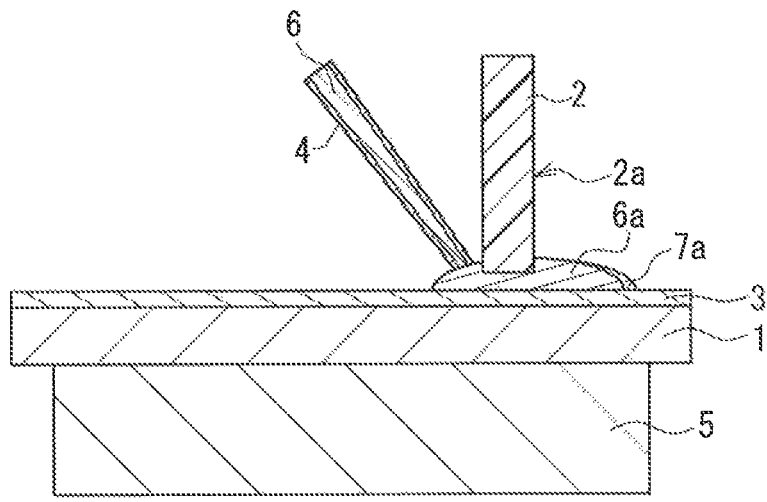
FIG. 1B is a cross-sectional view showing a state of an initial process of the above manufacturing method.
Figure 1C:
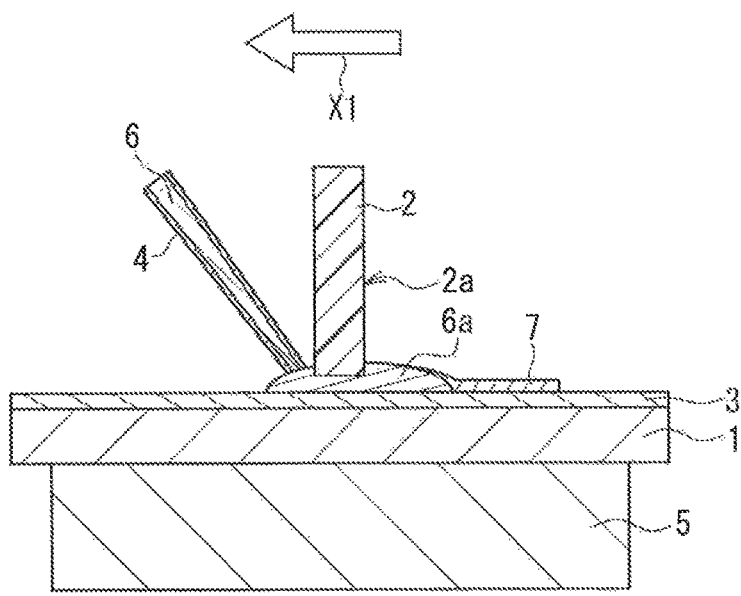
FIG. 1C is a cross-sectional view showing a state of a subsequent process of the process in FIG. 1B.
Figure 1D:
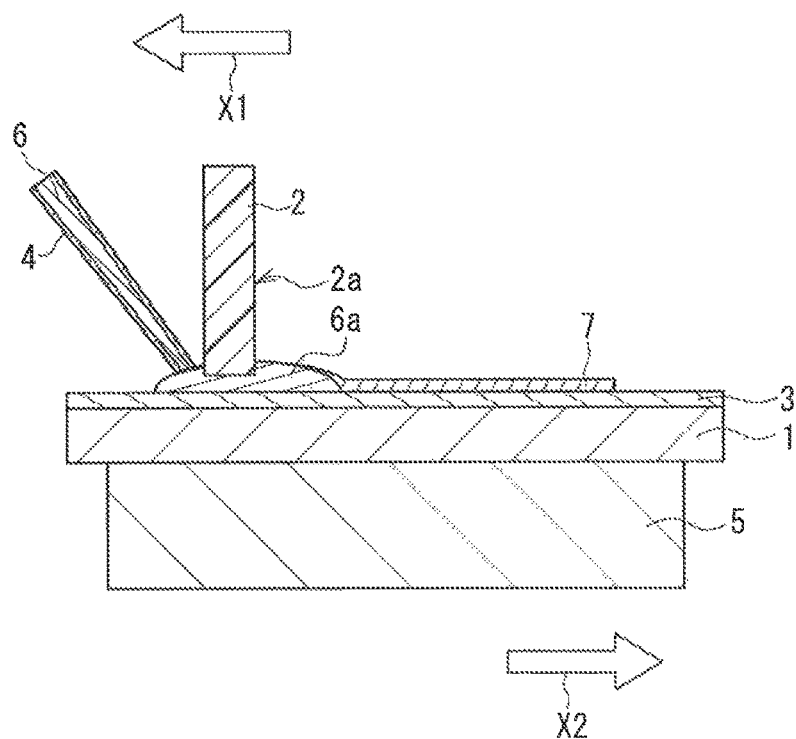
FIG. 1D is a cross-sectional view showing a state of a subsequent process of the process in FIG. 1C.
Figure 1E:
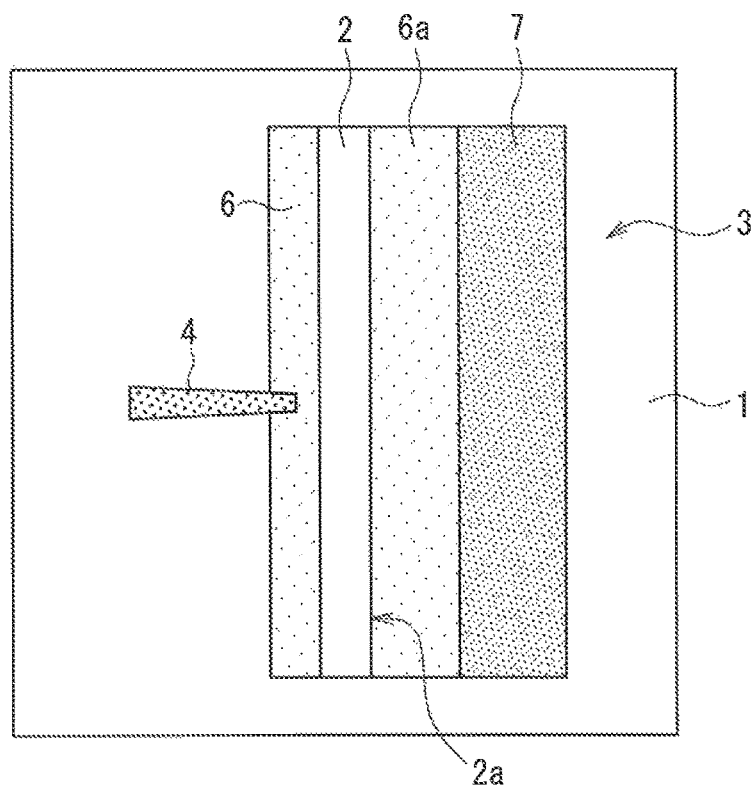
FIG. 1E is a plan view of the state shown in FIG. 1C.

A method for manufacturing an organic semiconductor thin film of an embodiment of the present invention will be described with reference to FIGS. 1A to 1C. In the manufacturing method, a raw material solution, in which an organic semiconductor material is dissolved in a solvent, is supplied to a substrate 1. Then, the solvent is evaporated so that crystals of the organic semiconductor material are precipitated. Thus, an organic semiconductor thin film is formed on the substrate. FIG. 1A is a cross-sectional view showing an apparatus used in the processes of a method for manufacturing an organic semiconductor thin film array. FIGS. 1B to 1D are cross-sectional views showing the states of the processes of the manufacturing method in consecutive order. FIG. 1E is a plan view of the state shown in FIG. 1C. In FIG. 1E, some elements are marked with dots, which do not represent cross sections, but help to distinguish the elements from one another.

In the apparatus of FIG. 1A, an edge forming member 2 is spaced from the substrate 1 by a predetermined gap g. One side of the edge forming member 2 (i.e., the right side in FIG. 1A) is a contact face 2a that controls the precipitation of crystals to form an organic semiconductor thin film. The edge forming member 2 is located opposite the substrate 1 so that the plane of the contact face 2a intersects the surface of the substrate 1 at a predetermined angle. FIG. 1B shows that the contact face 2a is at right angles to the surface of the substrate 1. A surface modification layer 3 is formed on the top surface of the substrate 1 to adjust the wettability within an appropriate range. A solution supply nozzle 4 is located on the opposite side (left side) of the edge forming member 2 with respect to the contact face 2a. The tip of the solution supply nozzle 4, i.e., a raw material solution supply port is adjacent to the gap g. A hot plate 5 is placed on the lower surface of the substrate 1 and maintains the substrate 1, e.g., at 80° C.

In the manufacturing process, as shown in FIG. 1B, a raw material solution 6, in which an organic semiconductor material is dissolved in a solvent, is ejected through an inner cavity of the solution supply nozzle 4. The raw material solution 6 is then supplied from the tip of the solution supply nozzle 4 to the surface modification layer 3. At the same time, since the substrate 1 is maintained at a predetermined temperature by the hot plate 5, the raw material solution 6 is heated to a predetermined temperature. In this manner, when the raw material solution 6 is supplied to the substrate 1 (the surface modification layer 3) from the opposite side of the edge forming member 2 with respect to the contact face 2a, the raw material solution 6 passes through the gap g, reaches the side of the contact face 2a, and comes into contact with the contact face 2a, thereby forming a droplet 6a.

The droplet 6a has a cross-sectional shape whose thickness, measured from the surface of the substrate 1, decreases with increasing distance from the contact face 2a. That is, the thickness decreases as the droplet 6a moves away from the contact face 2a to the right side of FIG. 1B. This shape is formed because one side of the droplet 6a is held via the contact with the contact face 2a. The shape of the droplet 6a can be appropriately controlled by adjusting the contact angle of the surface modification layer 3. The presence of the surface modification layer 3 improves the wettability of the surface to control the shape of the droplet 6a, so that the effect of defining the direction of the crystal growth can be sufficiently obtained, as will be described later.

In the manufacturing process under the above conditions, the solvent contained in the droplet 6a is evaporated by heat from the hot plate 5. Due to the evaporation, the saturation of the raw material solution 6 and the precipitation of crystals 7a of the organic semiconductor material occur successively in the far end portion of the droplet 6a relative to the contact face 2a.

In this embodiment, with the progress of the process, the substrate 1 and the edge forming member 2 are moved relative to each other in the direction of the arrow X1 or the arrow X2 in accordance with the vapor rate of the solvent, as shown in FIG. 1C. At least one of the substrate 1 and the edge forming member 2 are moved in the direction of the arrow X1 and in the direction of the arrow X2, respectively. In this case, the movement of the substrate 1 is described as an example. The following description refers to the direction containing the arrows X1, X2 as an X direction. The X direction is parallel to the surface of the substrate 1, and the arrows X1, X2 indicate the direction in which the edge forming member 2 moves away from the droplet 6a. FIGS. 1A to 1C show the changes in the relative position of the substrate 1 and the edge forming member 2 by the above relative movement.

At the same time as the relative movement, the raw material solution 6 is supplied so that a change in the size of the droplet 6a with the relative movement is maintained within a predetermined range. When the raw material solution 6 is supplied at a rate that is equal to the vapor rate of the solvent, the droplet 6a takes a rectangular shape and keeps the same dimensions. The substrate 1 is moved simultaneously with the supply of the raw material solution 6. Since the crystallization rate of the raw material solution 6 is about 1 mm/min to several cm/min under the normal conditions, the relative speed of the substrate 1 and the edge forming member 2 is also adjusted to be equal to that rate. As a result of these operations, the state shown in FIG. 1B is shifted to the state shown in FIG. 1C, and an organic semiconductor thin film 7 is continuously formed on the surface of the substrate 1 after the contact face 2a has been moved.

FIG. 1E is a plan view of the state shown in FIG. 1C. As shown in FIG. 1E, the planar shape of the droplet 6a is rectangular with one side being the width of the contact face 2a. Specifically, a contour line of the gas-liquid boundary of the droplet 6a, which is measured from the horizontal plane of the substrate 1, is parallel to the contact face 2a. Similarly, the organic semiconductor thin film 7 that is continuously formed with the relative movement of the substrate 1 and the edge forming member 2 also has a rectangular shape.

In the manufacturing method of this embodiment, the crystal growth will not end with the evaporation of the solvent from the raw material solution 6 because the raw material solution 6 is continuously supplied. Therefore, the organic semiconductor thin film 7 can be formed to have a desired large area in accordance with the width and movement distance of the edge forming member 2 (the contact face 2a), as shown in FIG. 1D. For example, a rectangular organic semiconductor single crystal with an area of not less than 5 cm×5 cm easily can be manufactured by the continuous process.

The organic semiconductor thin film 7 is formed as a single crystal with high crystallinity due to the following effect. As described above, the cross-sectional shape of the droplet 6a is asymmetric in the X direction, and the solvent is evaporated asymmetrically in the X direction. This produces the effect of defining the direction of the crystal growth. In other words, the crystals grow in the direction from the position away from the contact face 2a toward the contact face 2a. The heat capacity in a thin portion of the droplet 6a is smaller than that in a thick portion of the droplet 6a. Therefore, in the thin portion of the droplet 6a, the temperature decreases significantly with the removal of heat (i.e., heat of evaporation or latent heat) when the solvent is evaporated. Accordingly, the organic semiconductor compound dissolved in the solution is precipitated earlier in the thin portion than in the thick portion of the droplet 6a, so that the direction of the crystal growth is defined.

Because of the effect of controlling the crystallinity, the regularity of the molecular arrangement of the organic semiconductor material can be improved, and a uniform single crystal thin film can be formed continuously. In fact, the resultant organic semiconductor thin film 7 is in a highly crystallized form and has high mobility that cannot be achieved by the conventional organic transistor based on droplet formation, as will be described later. To make full use of these properties, it is desirable that the single crystal of the organic semiconductor thin film 7 is 1 cm or more on a side and 100 nm or less thick. Consequently, a variation in thickness can be controlled within ±20%, and the large-area organic semiconductor thin film 7 can have uniform mobility over the entire region, which is sufficient for practical use.

Various substrates such as a resin substrate, a glass substrate, a substrate in which a $SiO_2$ layer is formed on an impurity doped Si layer, and a substrate in which the surface of a conductive metal (e.g., copper or aluminum) is coated with a polymer insulating film (e.g., parylene or polyvinyl phenol) may be used as materials for the substrate 1.

In the above embodiment, the edge forming member 2 is located so that the contact face 2a is at right angles to the surface of the substrate 1. However, the edge forming member 2 may be located at a certain angle to the surface of the substrate 1. In such a case, the edge forming member 2 is located on the substrate 1 with the contact face 2a being inclined at a predetermined angle in the X direction. When the raw material solution is supplied and brought into contact with the contact face 2a in this state, it is easier to control the size of the wetted surface with the droplet 6a, and thus to provide the organic semiconductor thin film with desired properties.

The edge forming member 2 may be made of a resin, silicon wafer, or the like. However, any other materials can be used as long as they serve to form the droplet 6a appropriately.

Figure 2:
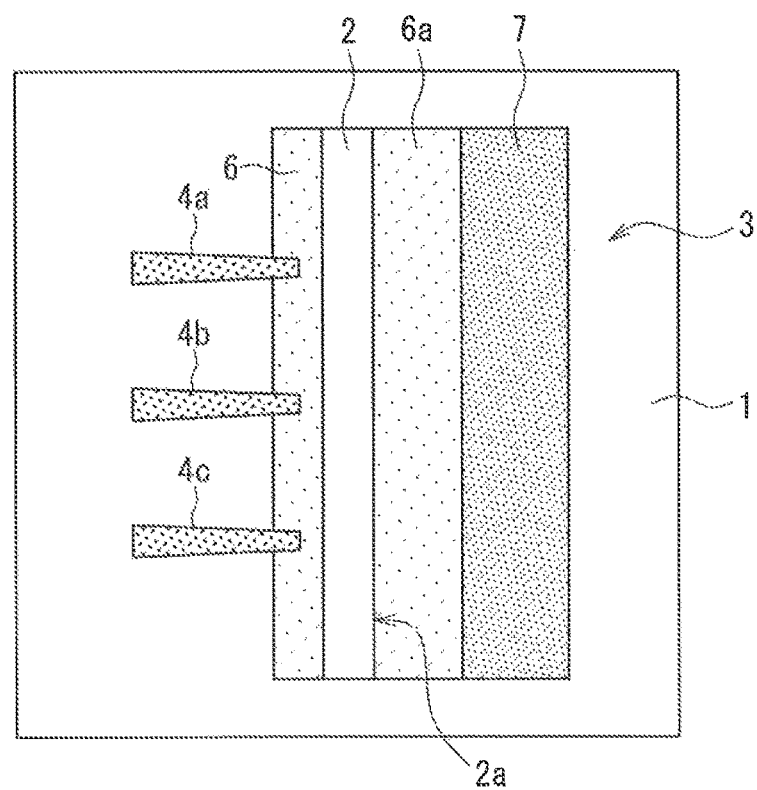
FIG. 2 is a plan view showing another embodiment of a solution supply nozzle used in the above manufacturing method.

The solution supply nozzle 4 may be configured as shown in the plan view of FIG. 2. The configuration shown in FIG. 1E includes one solution supply nozzle 4. On the other hand, the configuration shown in FIG. 2 includes three solution supply nozzles 4a to 4c. One or more solution supply nozzles 4 may be arranged as needed, and the raw material solution 6 may be supplied through the gap g from one or more raw material solution supply ports. When a plurality of solution supply nozzles 4 are provided, each of the solution supply nozzles 4 can supply different types of raw material solutions. In this manner, different types of organic semiconductor thin films can be simultaneously formed on the same substrate 1.

The source of supply of the raw material solution 6 is not limited to the nozzle, and may have any known configuration (not shown). Moreover, various shapes of nozzles may be selected in accordance with the purpose.

Figure 3A:
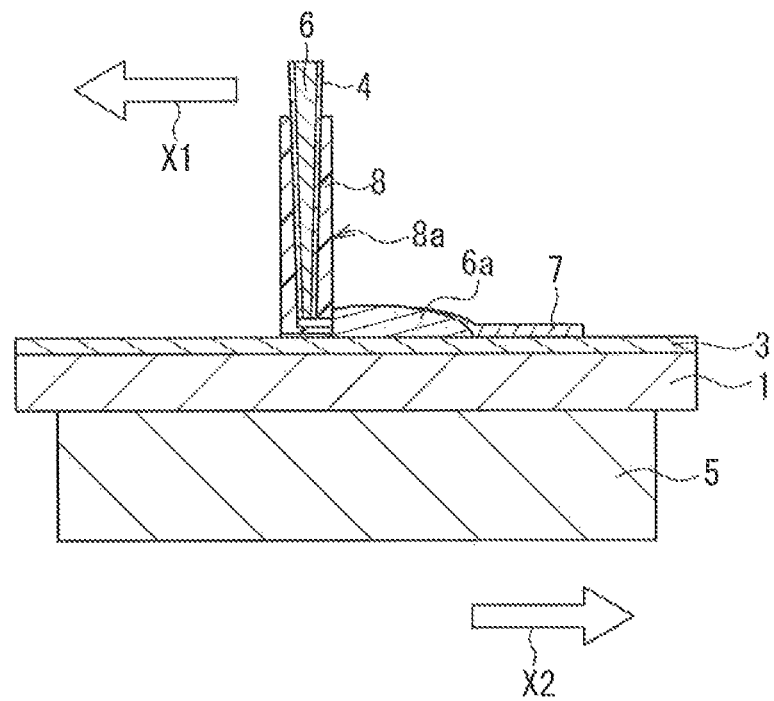
FIG. 3A is a cross-sectional view showing another embodiment of an edge forming member used in the above manufacturing method.
Figure 3B:
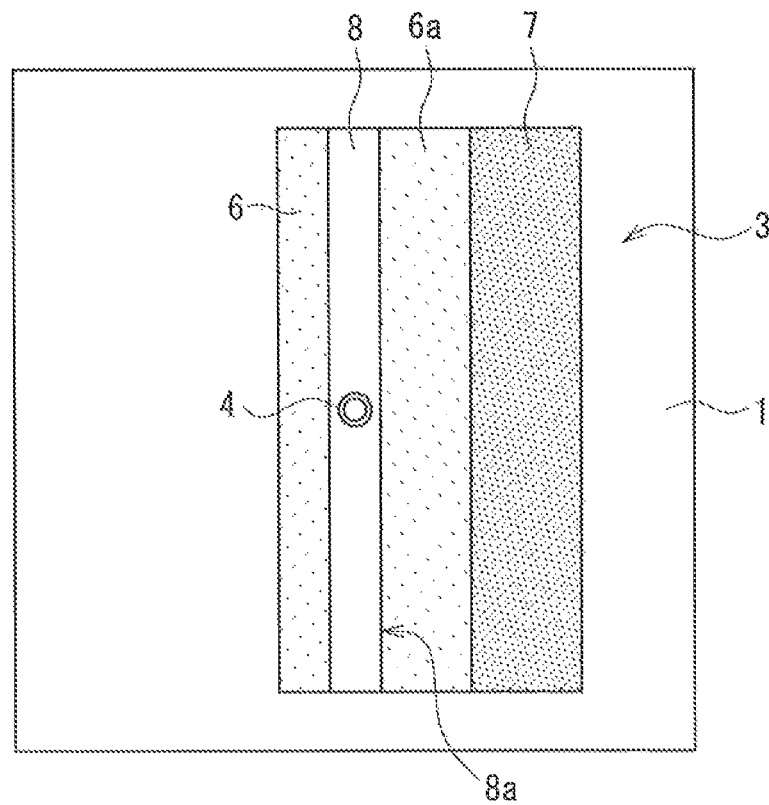
FIG. 3B is a plan view showing a shape of the edge forming member in FIG. 3A when viewed from the above.

Instead of the structure shown in FIG. 1A, the solution supply nozzle 4 may be arranged as shown in FIGS. 3A and 3B. FIG. 3A is a cross-sectional view showing an edge forming member 8 that is different in form from the edge forming member 2. FIG. 3B is a plan view showing the shape of the edge forming member 8 when viewed from the above. In this configuration, the solution supply nozzle 4 is inserted into an inner cavity of the edge forming member 8, and the raw material solution 6 is supplied through an opening connected to a contact face 8a of the edge forming member 8. This configuration can minimize the gap between the edge forming member 8 and the substrate 1.

Figure 4A:
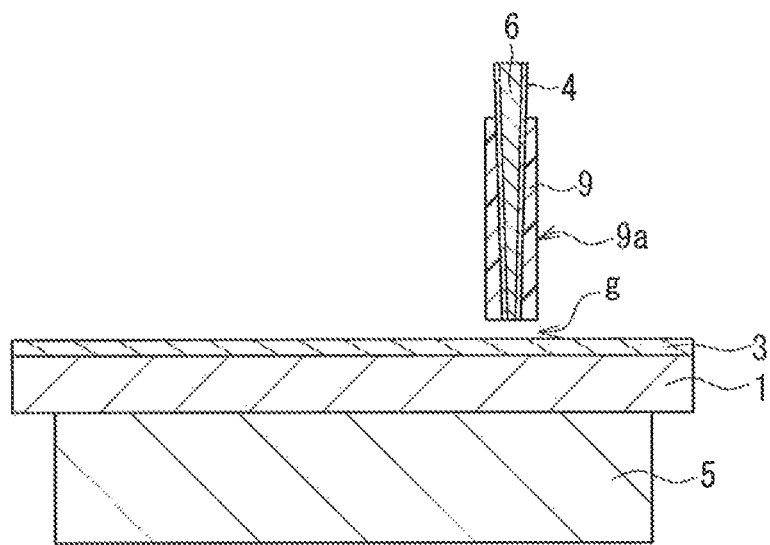
FIG. 4A is a cross-sectional view showing yet another embodiment of an edge forming member used in the above manufacturing method.
Figure 4B:
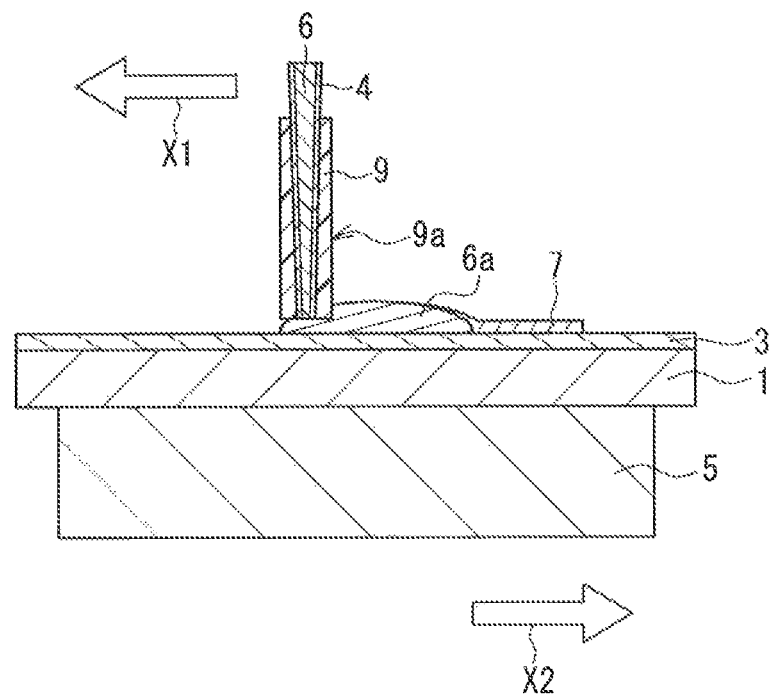
FIG. 4B is a cross-sectional view showing a process using the edge forming member.

Moreover, the edge forming member 8 shown in FIG. 3A can be modified to an edge forming member 9 shown in FIG. 4A. The edge forming member 9 is spaced from the substrate 1 by a predetermined gap g, and the tip of the solution supply nozzle 4 is open to the surface of the substrate 1 directly under the edge forming member 9. As shown in FIG. 4B, the edge forming member 9 and the substrate 1 are moved relative to each other while the raw material solution 6 is supplied to the surface of the substrate 1 directly under the edge forming member 9. Thus, as in the case shown in FIGS. 1B to 1D, the organic semiconductor thin film 7 can be continuously formed under the control of a contact face 9a.

The configurations shown in FIGS. 3A and 4A may include one or more solution supply nozzles 4. When a plurality of solution supply nozzles 4 are used, each of the solution supply nozzles 4 can supply different types of raw material solutions. In this manner, different types of organic semiconductor thin films can be simultaneously formed on the same substrate 1.

It is desirable that the organic semiconductor compound have high self-aggregation properties to form an organic semiconductor thin film by the above method. The self-aggregation properties mean that molecules tend to spontaneously aggregate and form crystals as they are precipitated from a solvent. Therefore, the organic semiconductor material suitable for this embodiment may include the following organic semiconductor compounds.

For example, the organic semiconductor compounds may be: [1]benzothieno[3,2-b]benzothiophene derivatives; 2,9-dialkyldinaphtho[2,3-b:2',3'-f]thieno[3,2-b]thiophene derivatives; dinaphtho[2,3-b:2,3-f]thiopheno[3,2-b]thiophene derivatives; TIPS-pentacene, TES-ADT, and their derivatives; perylene derivatives; TCNQ, F4-TCNQ, F4-TCNQ, rubrene, pentacene, p3HT, pBTTT, pDA2T-C16, dinaphthodithiophene, dinaphthobenzodithiophene, dinaphthonaphthodithiophene, flexible-type chalcogenophene compounds, and their derivatives.

It is desirable that the contact angle between the raw material solution 6 and the substrate 1 be adjusted to 30° or less during the crystal growth by the presence of the surface modification layer 3. This allows the direction of the crystal growth to be easily and sufficiently defined based on the shape of the droplet 6a. The surface modification layer 3 formed by the treatment with, e.g., a silane-based self-assembled monomolecular film is effective in improving the wettability of the surface of the substrate 1.

The above organic semiconductor thin film formed by the method of this embodiment was measured by X-ray diffraction to study the crystallinity of the single crystal thin film.

Newly developed didecyl dinaphthobenzodithiophene was used as an organic semiconductor material. This material has a high mobility of about 16 $cm^2/Vs$ in the form of a single crystal transistor. A didecyl dinaphthobenzodithiophene powder was added at a concentration of 0.025 wt % to a typical high boiling solvent, and then the solvent was heated up to 70° C. so that the powder was fully dissolved. This solution was used to form an organic semiconductor thin film.

The microscope observation of the organic semiconductor thin film thus formed showed a very uniform crystalline state. When the organic semiconductor thin film was observed with a cross-polarizing microscope by rotating a polarizing plate to change the polarization direction and the direction of the crystallographic axis, the gloss of the thin film was simultaneously changed over the entire surface of the thin film with the rotation of the sample. The results of the observation confirmed that the crystallographic axes were aligned in substantially the same direction over the entire surface of the thin film, and that a single crystal thin film was formed over an area of several square centimeters. Such a single crystal thin film is advantageous for the application to large-area electronic devices.

The crystal structure and crystallinity of the thin film were examined by X-ray diffraction (XRD) measurement. To perform the XRD measurement, the thin film was formed on a glass substrate with a thickness of 20 μm, through which X-rays passed. The results of the XRD measurement showed that the molecules of the organic semiconductor were oriented normal to the substrate (i.e., edge-on orientation), and confirmed that the thin film was a good organic single crystal thin film.

Figure 5A:
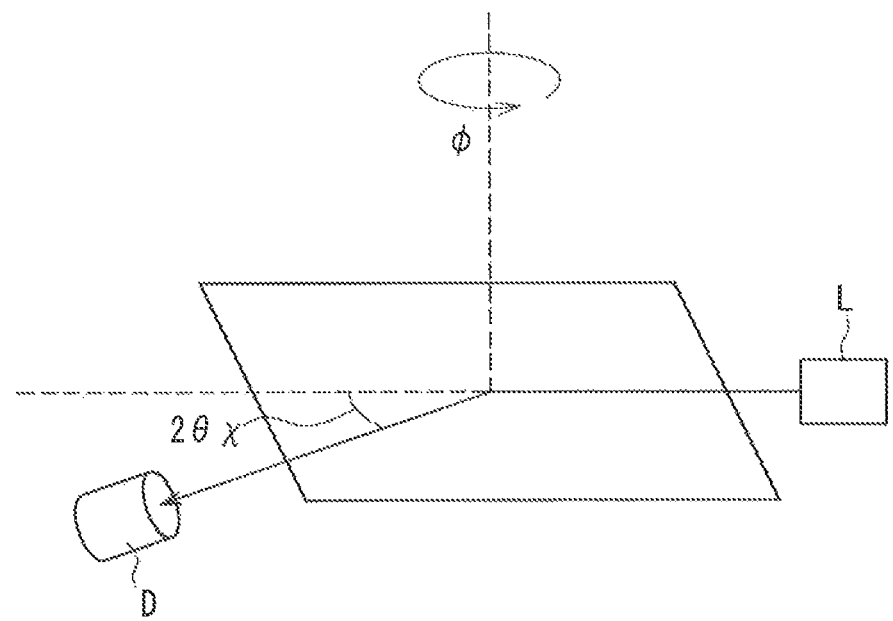
FIG. 5A is a diagram showing an optical system for an in-plane GIXD measurement of an organic semiconductor thin film obtained by the above manufacturing method.
Figure 5B:
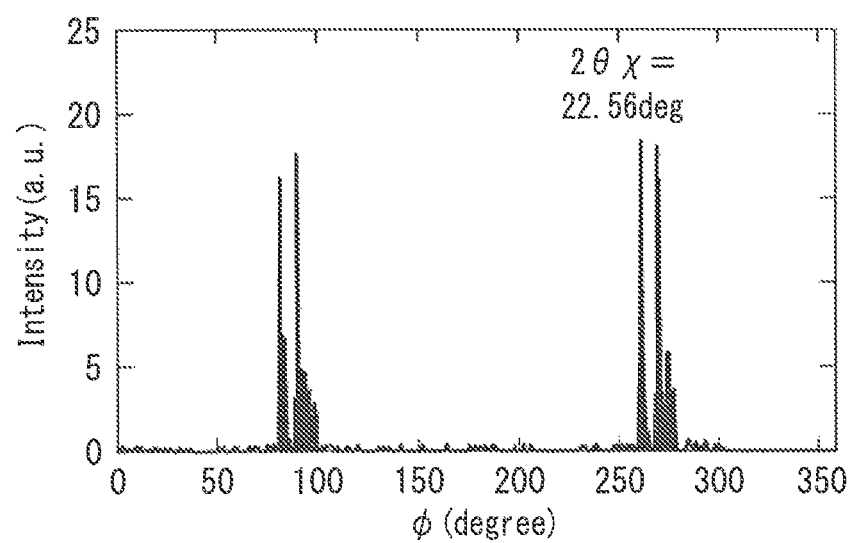
FIG. 5B is a diagram showing a distribution of diffraction peaks as a result of the GIXD measurement.

Moreover, low angle incidence X-ray diffraction (GIXD) measurement was performed using an optical system shown in FIG. 5A. The thin film was rotated in the φ direction and irradiated with X-rays from a light source L. The light diffracted by the organic single crystal thin film was detected by a detector D. Then, the distribution of the diffraction peaks was measured when the thin film rotated in the φ direction. The 2θx axis was set to 22.56 degrees. FIG. 5B shows the results of the measurement. As shown in FIG. 5B, the distribution of the crystallographic axes of the organic single crystal thin film of several square centimeters were extremely uniform and fell in a narrow range of 8°.

Figure 6:
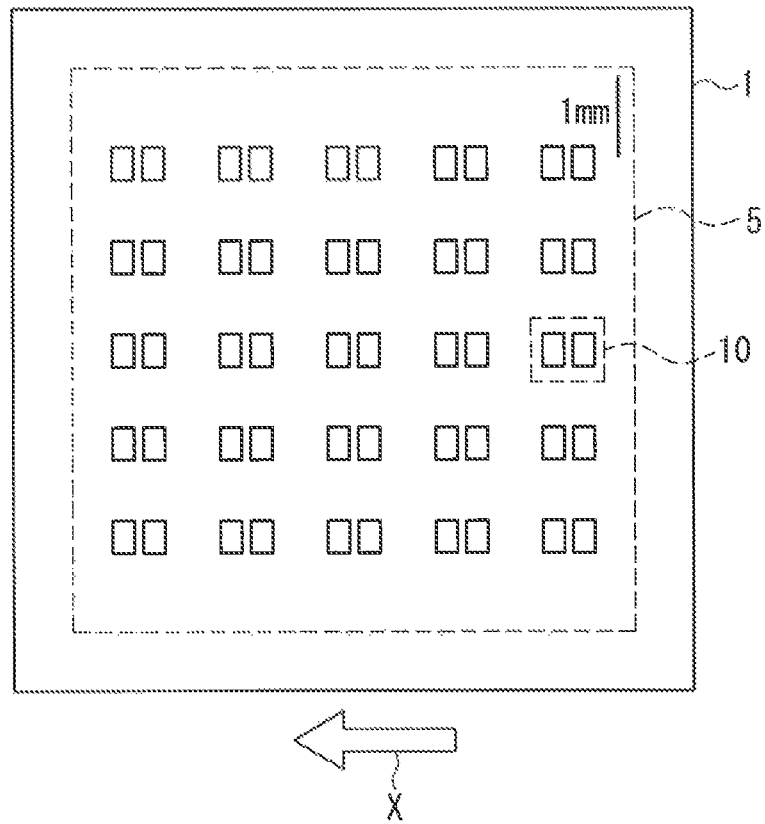
FIG. 6 is a plan view showing a thin film transistor array using an organic semiconductor thin film obtained by the above manufacturing method.

As shown in FIG. 6, an array of 5×5 TFT elements 10 was manufactured to evaluate the properties of a thin film transistor (TFT element) using the organic semiconductor single crystal thin film obtained by the method of this embodiment.

The substrate 1 was a silicon wafer, and a thermally oxidized $SiO_2$ film with a thickness of 100 nm was formed as a gate insulating film. An organic semiconductor thin film was formed on the $SiO_2$ film in the above manner, and the surface of the thin film was treated with β-PTS-SAM. On top of the thin film, a 2 nm thick p-dopant layer was formed, and further a 30 nm thick source electrode and a 30 nm thick drain electrode were formed. Thus, the array of the TFT elements 10 was manufactured. The source electrode and the drain electrode were arranged with their channels parallel to the X direction, i.e., the direction of the crystal growth.

Figure 7:
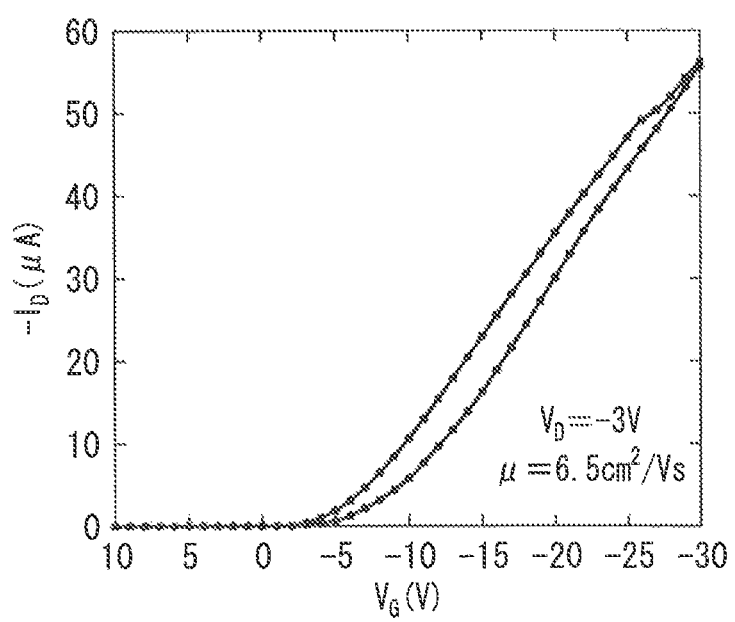
FIG. 7 is a diagram showing transfer characteristics in a linear region of a thin film transistor as a representative example of the thin film transistor array.

FIG. 7 shows the transfer characteristics in a linear region of the TFT element 10 as a representative example of the thin film transistor array thus manufactured.

Figure 8:
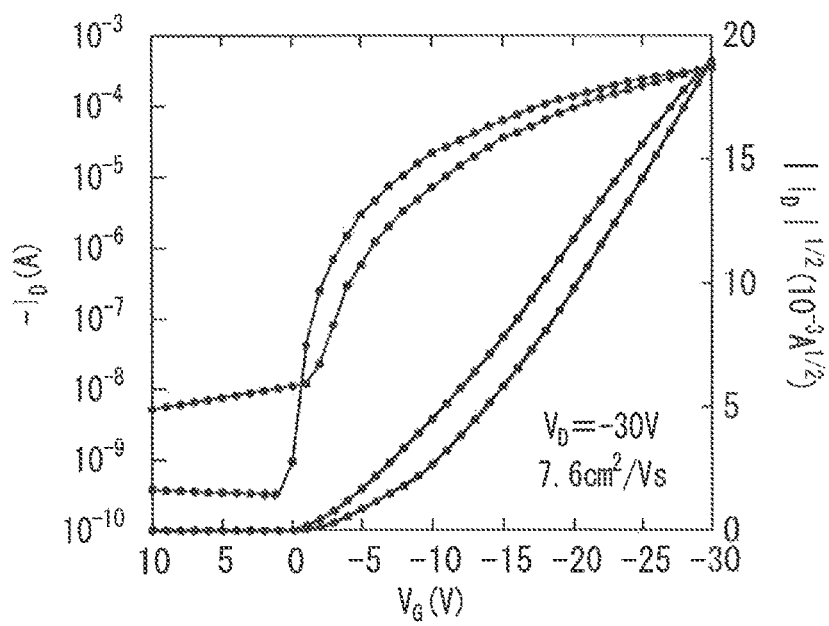
FIG. 8 is a diagram showing transfer characteristics in a saturation region of the thin film transistor.
Figure 9:
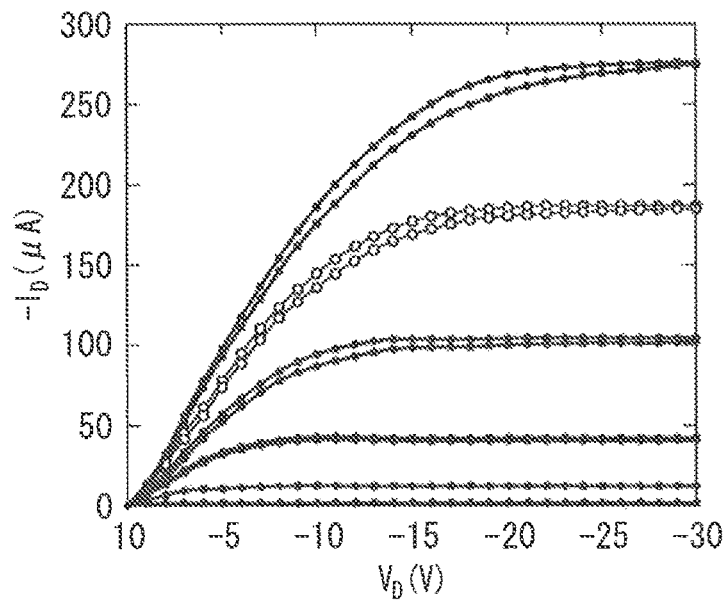
FIG. 9 is a diagram showing output characteristics of the thin film transistor.

In FIG. 7, the horizontal axis represents a gate voltage (V), and the vertical axis represents a drain current (μA). FIG. 8 shows the transfer characteristics in a saturation region of the TFT element 10. In FIG. 8, the horizontal axis represents a gate voltage (V), the left vertical axis represents the square root of the absolute value of a drain current, and the right vertical axis represents the logarithmic scale of the drain current (A). The mobility calculated from the inclination of the plot reached 7.6 $cm^2/Vs$ or more in the saturation region and 6.5 $cm^2/Vs$ or more in the linear region. The difference in the mobility between the two regions corresponds to the nonlinearity in the output characteristics shown in FIG. 9. FIG. 9 shows the output characteristics at a gate voltage VG of 0 V, −20 V, −30 V, −40 V, and −50V, respectively.

Figure 10:
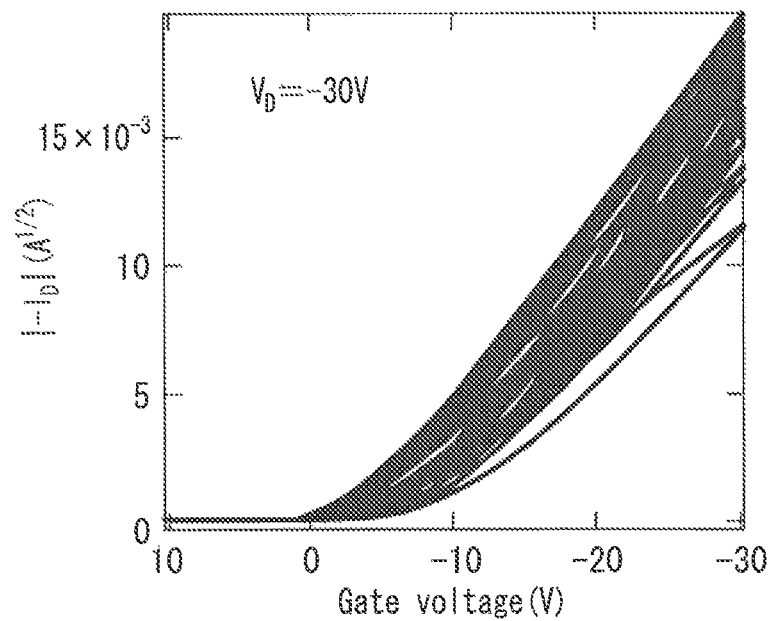
FIG. 10 is a diagram showing a distribution of transfer characteristics of all thin film transistors of the thin film transistor array.
Figure 11:
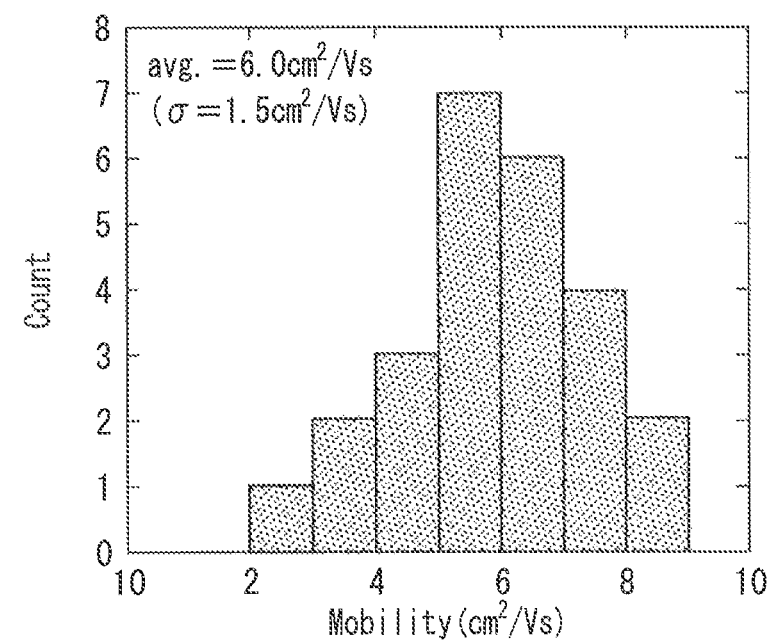
FIG. 11 is a diagram showing a distribution of mobility of the thin film transistor array.
Figure 12:
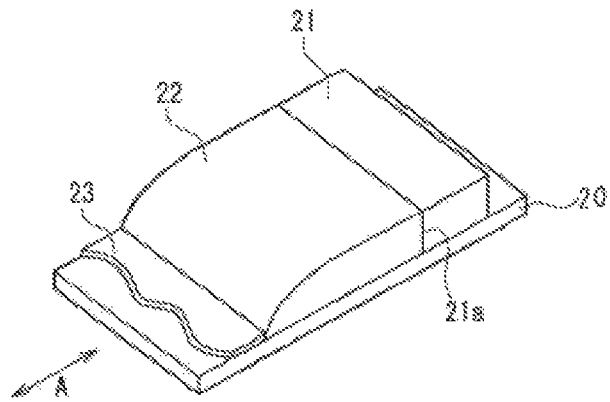
FIG. 12 is a perspective view showing a basic process of a method for manufacturing an organic semiconductor thin film in a conventional example.
Figure 13:
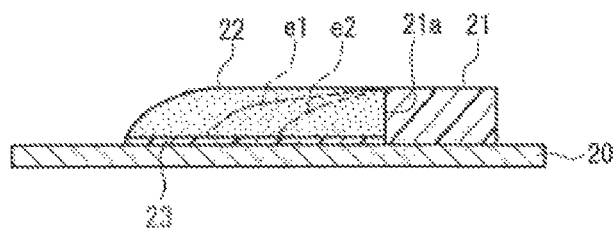
FIG. 13 is a cross-sectional view showing the basic process of the conventional manufacturing method.
Figure 14:
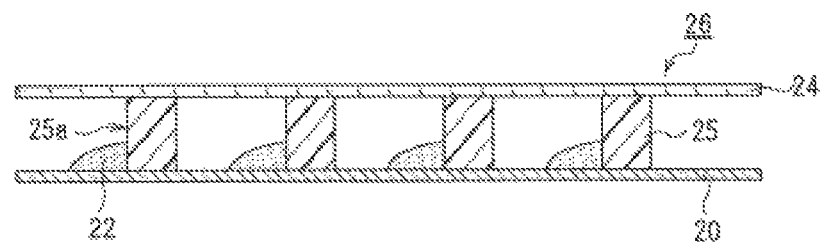
FIG. 14 is a cross-sectional view showing a method for manufacturing an organic semiconductor thin film array using the basic process of the conventional manufacturing method.
Figure 15:
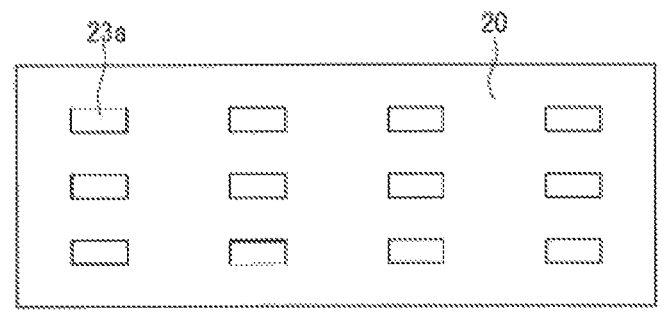
FIG. 15 is a plan view of an organic semiconductor thin film array obtained by the conventional manufacturing method.

FIG. 10 shows the distribution of the transfer characteristics of all the TFT elements 10 of the thin film transistor array. FIG. 11 shows the distribution of the mobility of the thin film transistor array. Consequently, all the TFT elements 10 were operated with a high mobility of 3 cm$^2$/Vs or more. The average mobility of the 25 TFT elements 10 reached 6.0 cm$^2$/Vs, and the standard deviation of the mobility was 1.5 cm$^2$/Vs. This value was 20% of the average mobility and very small.

As described above, the organic semiconductor thin film manufactured in this embodiment is a single crystal thin film with high crystallinity and can easily be formed to have a large area. Moreover, the thin film transistor array manufactured using this organic semiconductor thin film has high mobility over the entire region.

INDUSTRIAL APPLICABILITY

The method for manufacturing an organic semiconductor thin film of the present invention is performed by a simple process using a solvent evaporation method based on droplet formation, and can provide a large-area organic semiconductor single crystal thin film having high charge mobility. Thus, the method is useful for the manufacture of an organic transistor or the like.

DESCRIPTION OF REFERENCE NUMERALS 1, 20 Substrate
2, 8, 9 Edge forming member
2a, 8a, 9a, 21a, 25a Contact face
3 Surface modification layer
4, 4a to 4c Solution supply nozzle
5 Hot plate
6 Raw material solution
6a, 22 Droplet
7a Crystal
7, 23, 23a Organic semiconductor thin film
10 TFT element
21 Edge contact member
24 Auxiliary substrate
25 Contact protrusion
26 Contact member

The invention claimed is:

1. A method for manufacturing an organic semiconductor thin film, comprising:
supplying a raw material solution, in which an organic semiconductor material is dissolved in a solvent, to a substrate;
evaporating the solvent so that crystals of the organic semiconductor material are precipitated; and
forming an organic semiconductor thin film on the substrate,
wherein the method uses an edge forming member having a contact face on one side,
the edge forming member is located opposite the substrate so that a plane of the contact face intersects a surface of the substrate at a predetermined angle,
the raw material solution is supplied to the substrate and while the raw material solution contacts the substrate, the raw material solution is brought into contact with the contact face to form a droplet of the raw material solution,
the substrate and the edge forming member are moved relative to each other in a direction parallel to the surface of the substrate so as to separate the edge forming member from the droplet, and while the raw material solution is supplied, the solvent contained in the droplet is evaporated and crystals of the organic semiconductor material are continuously precipitated on the substrate after the contact face has been moved in accordance with the supply of the raw material solution, and
in the precipitation process, a supply rate of the raw material solution and a speed of the relative movement are adjusted in accordance with a vapor rate of the solvent, so that a size of the droplet in the direction of the relative movement is maintained within a predetermined range in which an effect of defining a direction of growth of the crystals is obtained via an attachment of the droplet to the contact face.

2. The method for manufacturing an organic semiconductor thin film according to claim 1, wherein the droplet is formed to have a shape whose thickness, measured from the surface of the substrate, gradually decreases with increasing distance from the contact face.

3. The method for manufacturing an organic semiconductor thin film according to claim 1, wherein the surface of the substrate on which the droplet of the raw material solution is formed has a contact angle of 30° or less with the raw material solution.

4. The method for manufacturing an organic semiconductor thin film according to claim 1, wherein the edge forming member is spaced from the substrate by a predetermined gap, and the raw material solution is supplied through the gap from one or more raw material solution supply ports that are located adjacent to the gap on an opposite side of the edge forming member with respect to the contact face.

5. The method for manufacturing an organic semiconductor thin film according to claim 4, wherein a plurality of the raw material solution supply ports are provided, and each of the raw material solution supply ports supplies different types of raw material solutions, so that different types of organic semiconductor thin films are simultaneously formed on the same substrate.

6. The method for manufacturing an organic semiconductor thin film according claim 1, wherein the raw material solution is supplied to a side of the edge forming member facing the contact face through one or more inner cavities provided inside of the edge forming member.

7. The method for manufacturing an organic semiconductor thin film according to claim 1, wherein the edge forming member is spaced from the substrate by a predetermined gap, and the raw material solution is supplied to the surface of the substrate directly under the edge forming member through one or more inner cavities provided inside of the edge forming member.

8. The method for manufacturing an organic semiconductor thin film according to claim 7, wherein the edge forming member has a plurality of the inner cavities, and different types of raw material solutions are supplied through each of the inner cavities, so that different types of organic semiconductor thin films are simultaneously formed on the same substrate.

9. An organic semiconductor device comprising:
a substrate; and
an organic semiconductor thin film formed on a surface of the substrate,
wherein the organic semiconductor thin film is manufactured by the method according to claim 1, and is a single crystal thin film having a rectangular planar shape that is 1 cm or more on a side and 100 nm or less thick.

10. The organic semiconductor device according to claim 9, wherein a distribution of angles between directions of each of crystallographic axes of the organic semiconductor thin film is in a range of 8°.

11. The organic semiconductor device according to claim 9, wherein the surface of the substrate on which the organic semiconductor thin film is formed has a contact angle of 30° or less with the raw material solution.

* * * * *